United States Patent
Chen

(10) Patent No.: US 11,112,655 B2
(45) Date of Patent: Sep. 7, 2021

(54) METHOD FOR MANUFACTURING SPACER UNIT OF DISPLAY PANEL AND METHOD FOR MANUFACTURING THE DISPLAY PANEL

(71) Applicants: HKC Corporation Limited, Guangdong (CN); Chongqing HKC Optoelectronics Technology Co., Ltd., Chongqing (CN)

(72) Inventor: Yu-Jen Chen, Chongqing (CN)

(73) Assignees: HKC Corporation Limited, Shenzhen (CN); Chongqing HKC Optoelectronics Technology Co., Ltd., Chongqing (CN)

(*) Notice: Subject to any disclaimer, the term of this patent is extended or adjusted under 35 U.S.C. 154(b) by 0 days.

(21) Appl. No.: 16/625,547

(22) PCT Filed: Aug. 10, 2017

(86) PCT No.: PCT/CN2017/096709
§ 371 (c)(1),
(2) Date: Dec. 20, 2019

(87) PCT Pub. No.: WO2019/000593
PCT Pub. Date: Jan. 3, 2019

(65) Prior Publication Data
US 2020/0348551 A1    Nov. 5, 2020

(30) Foreign Application Priority Data

Jun. 29, 2017   (CN) .......................... 201710514938.9

(51) Int. Cl.
*G02F 1/1339* (2006.01)
*H01L 27/12* (2006.01)
(Continued)

(52) U.S. Cl.
CPC ........ *G02F 1/13394* (2013.01); *G02F 1/0107* (2013.01); *G02F 1/1333* (2013.01);
(Continued)

(58) Field of Classification Search
CPC combination set(s) only.
See application file for complete search history.

(56) References Cited

U.S. PATENT DOCUMENTS

2012/0282774 A1   11/2012   Wei

FOREIGN PATENT DOCUMENTS

| CN | 10-1042526 | * | 6/2010 | ............... G03F 1/14 |
| CN | 101042526 B | | 6/2010 | |

(Continued)

*Primary Examiner* — Lauren Nguyen
(74) *Attorney, Agent, or Firm* — Muncy, Geissler, Olds & Lowe, P.C.

(57) ABSTRACT

A method for manufacturing a spacer unit of a display panel, manufacturing a mask and manufacturing a display panel is provided. The method for manufacturing the spacer unit of the display panel includes the following steps of: setting up a multi-tone first mask, and at least two exposure units are disposed on the first mask; forming a plurality of test spacer units through an exposure process using the first mask and recording production data; providing a second mask for manufacturing the display panel based on the production data; and fabricating the spacer units of the display panel by adopting the second mask.

16 Claims, 11 Drawing Sheets

(51) Int. Cl.
*G02F 1/01* (2006.01)
*G02F 1/1333* (2006.01)

(52) U.S. Cl.
CPC ........ *G02F 1/1339* (2013.01); *G02F 1/13396* (2021.01); *H01L 27/1288* (2013.01)

(56) References Cited

FOREIGN PATENT DOCUMENTS

| | | | | |
|---|---|---|---|---|
| CN | 102314074 A | 1/2012 | | |
| CN | 202453606 U | 9/2012 | | |
| CN | 103299241 A | 9/2013 | | |
| CN | 103941483 A | 7/2014 | | |
| CN | 104199203 A | 12/2014 | | |
| CN | 105807503 A | 7/2016 | | |
| CN | 205992105 U | 3/2017 | | |
| CN | 20-5992105 | * | 1/2019 | ........... G02F 1/1335 |
| JP | 4852848 B2 | 1/2012 | | |
| WO | WO-2017/086590 A1 | 5/2017 | | |

* cited by examiner

METHOD FOR MANUFACTURING SPACER UNIT OF DISPLAY PANEL AND METHOD FOR MANUFACTURING THE DISPLAY PANEL

BACKGROUND

Technical Field

This disclosure relates to a technical field of a display, and more particularly to a method for manufacturing a spacer unit of a display panel, manufacturing a mask, and manufacturing the display panel.

Related Art

The liquid crystal display has many advantages, such as the slim body, power saving, non-radiation and the like, and has been widely used. Most of the LCD displays currently available are backlight type displays, which include a display panel and a backlight module. The working principle of the display panel is to refract the light emitted from the backlight module to generate an image through liquid crystal molecules placed in two parallel substrates and applied with a driving voltage across the two substrates so as to control the orientations of the liquid crystal molecules.

A thin film transistor-liquid crystal display (TFT-LCD) has advantages such as low energy consumption, excellent image quality, high production yield and the like, and has now gradually occupied the dominant position in the display field. Similarly, the TFT-LCD includes the display panel and the backlight module. The display panel includes a color filter substrate (CF substrate) and a thin film transistor substrate (TFT substrate), and a transparent electrode is disposed on the opposing inner side of each of the above-mentioned substrates. A layer of liquid crystal (LC) molecules is disposed between the two substrates. The display panel controls orientations of the liquid crystal molecules by an electric field to change the polarization state of light, and utilizes polarizers to allow the light to penetrate therethrough or to block the optical to implement the objective of display.

In the current display panel industry, in order to produce the spacer unit(s) with proper height(s), it is necessary to perform the reproduction test(s) of the manufacturing process. A good control of the height of the spacer unit(s) is obtained only after correcting the penetration rate of masks or adjusting the exposure energy for manufacturing process for several times. However, it may cause wastes of the associated testing cost or mask development cost.

SUMMARY

The technical problem to be solved by this disclosure is to provide a method of manufacturing a spacer unit of a display panel to effectively reduce the manufacturing costs.

In addition, the present disclosure further provides a display panel.

To achieve the above objective(s), the present disclosure provides a method for manufacturing a spacer unit of a display panel. The method comprises the following steps of: setting up a multi-tone first mask, and at least two exposure units are disposed on the multi-tone first mask; forming a plurality of test spacer units by an exposure process using the first mask and recording production data; providing a second mask for manufacturing the display panel based on the production data; fabricating the spacer unit of the display panel by adopting the second mask.

In one embodiment, during forming a plurality of test spacer units by an exposure process using the first mask and recording production data, the method comprises the following steps: setting up the first mask above a test spacer material; forming the test spacer units by exposing the test spacer material under the same exposure condition; and, recording the production data. The production data comprises exposure energy, penetration rates of the exposure units, dimensions of apertures of the exposure units and/or dimensions of the spacer units.

In one embodiment, during forming a plurality of test spacer units by an exposure process using the first mask and recording production data, the method comprises the following steps: setting up the first mask above a test spacer material; setting an independent light source corresponding to each of the exposure units and the independent light sources are spaced from one another; forming the test spacer units by exposing under different exposure conditions; and, recording the production data.

In one embodiment, during providing a second mask for manufacturing the display panel based on the production data, the method comprises: processing the production data through an algorithm; calculating exposure energy required for production, and penetration rates and dimensions of apertures of the exposure units of the second mask with multi-tone; and, producing the second mask.

In one embodiment, the display panel comprises a substrate and a transparent electrode layer disposed on the substrate, and during fabricating the spacer unit of the display panel by adopting the second mask, the method comprises the following steps: disposing a spacer unit material on the transparent electrode layer; obtaining patterns of the spacer units through the second mask; and obtaining the spacer units via etching with an etchant.

In one embodiment, the dimensions of the apertures of the exposure units of the first mask are the same, and the penetration rates of any two of the exposure units are different.

In one embodiment, there are a plurality of first masks. The dimensions of the apertures of the exposure units are varied for each first mask, and the penetration rates of the exposure units at the same position of each first mask are the same.

In one embodiment, the penetration rates of the exposure units in the same first mask are the same, and the dimensions of the apertures of any two of the exposure units in the same first mask are different.

According to another aspect of this disclosure, this disclosure further discloses a method for manufacturing a mask. The method comprises the following steps of: forming a translucent layer on a transparent substrate, forming an etching stop layer on the translucent layer, forming a light-shielding layer on the etch stop layer, and forming exposure units corresponding to the spacer units of the display panel through an etching process.

According to another aspect of this disclosure, this disclosure further discloses a method for manufacturing a display panel. The method comprises the following steps of: providing a first substrate, form a spacer unit on the first substrate by a mask, and the mask comprises a plurality of exposure units with various penetration rates; providing a second substrate; and assembling the first substrate and the second substrate and forming a liquid crystal layer between the first substrate and the second substrate.

In this disclosure, since at least two exposure units are provided on the first mask, a plurality of test spacer units are formed by the first mask for exposure. Before manufacturing the display panel, a plurality of sets of production data can be conveniently obtained after one or multiple exposures. It is not necessary to adjust the manufacturing parameters repeatedly during the actual manufacturing process. According to the production data, the manufacturing parameters can be obtained after one-time adjustment. The manufacturing time can be effectively shortened, and the testing cost can be reduced. The manufacturing capacity and the output of the display panel can be further increased. The manufacturing process of the display panel can be effectively simplified, and a better production efficiency of the display panel can be obtained. Moreover, the times of manufacturing and disposing the mask are effectively reduced, and waste of materials is further reduced. The manufacturing costs can be further saved, so as to obtain a better protection for the environment. In the subsequent manufacturing process of the display panel, the dimensions of the spacer units is accurately controlled through precisely controlling the exposure energy, the penetration rates of the exposure units and the dimensions of the apertures of the exposure units. Hence, the specification of the spacer unit with a fine precision is further elevated. Therefore, the conformity of the cell gap of the liquid crystal cell is better controlled, and the light-leakage condition of the display panel is further reduced, such that the contrast ratio of the display panel is also further increased. The required second mask may be obtained via utilizing the production data, and the exposure energy can be accurately controlled through adopting the second mask. Hence, the manufacturing time of the spacer unit can be shortened, and the manufacturing capacity and the output of the display panel can also be increased. The manufacturing process of the display panel can be simplified, and the production efficiency of the display panel can be further improved.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

Figure 1:
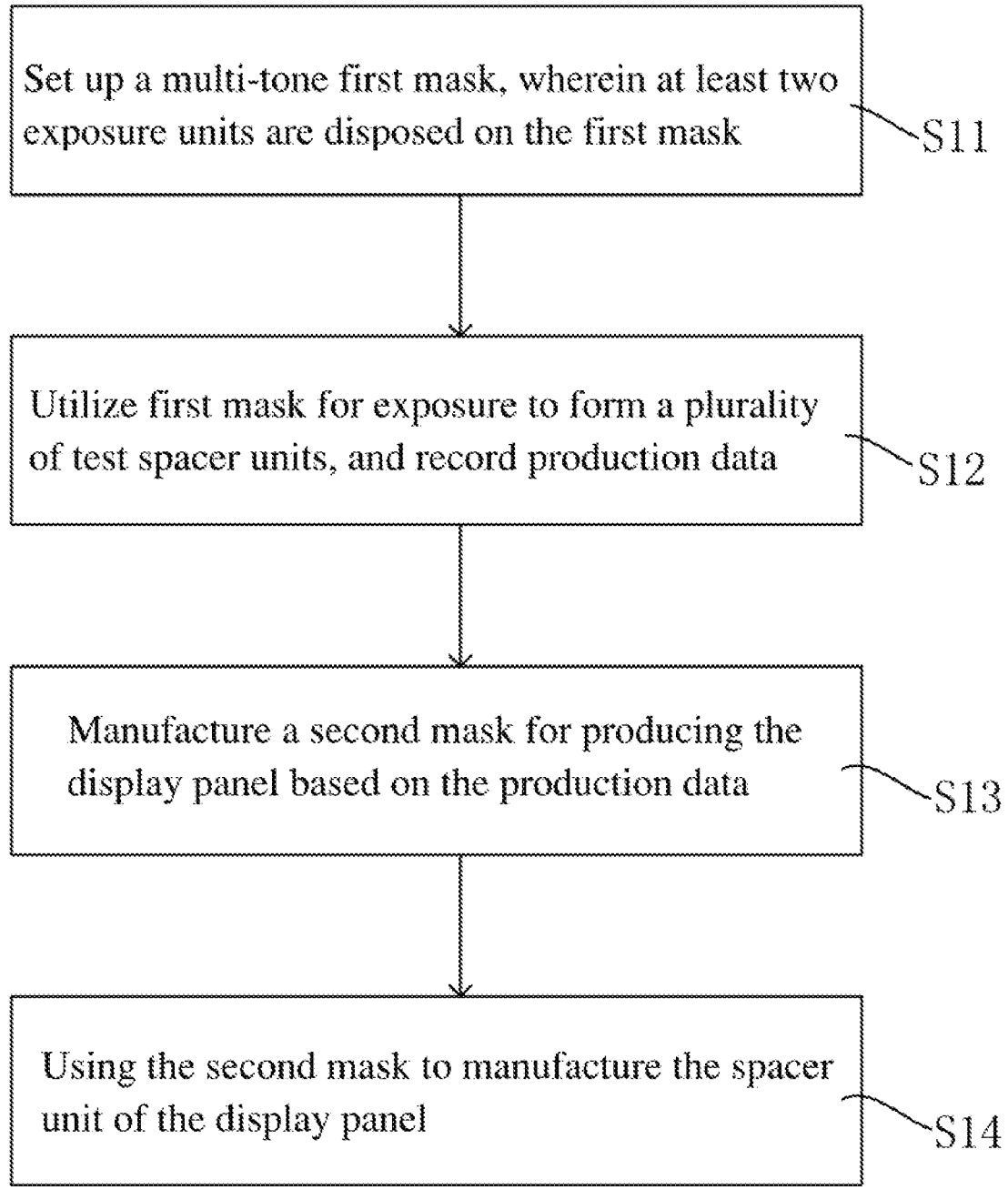
FIG. 1 is a flow chart showing a manufacturing method of a spacer unit of a display panel according to one embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure is further described below with reference to the accompanying drawings and examples.

As shown in FIG. 1, a method for manufacturing a spacer unit of a display panel comprises the following steps. Step S11: setting up a multi-tone first mask. At least two exposure units are disposed on the first mask. Step S12: forming a plurality of test spacer units through an exposure process using the first mask, and then recording production data. Step S13: providing a second mask for manufacturing the display panel based on the production data. And, Step S14: fabricating the spacer unit of the display panel by adopting the second mask.

In this embodiment, the production data comprises exposure energy, penetration rates of the exposure units, dimensions of apertures of the exposure units and/or dimensions of the spacer units.

Since at least two exposure units are provided on the first mask, a plurality of test spacer units are formed by the first mask for exposure. Before manufacturing the display panel, a plurality of sets of production data can be conveniently obtained after one or multiple exposures. It is not necessary to adjust the manufacturing parameters repeatedly during the actual manufacturing process. According to the production data, the manufacturing parameters can be obtained after one-time adjustment. The manufacturing time can be effectively shortened, and the testing cost can be reduced. The manufacturing capacity and the output of the display panel can be further increased. The manufacturing process of the display panel can be effectively simplified, and a better production efficiency of the display panel can be obtained. Moreover, the times of manufacturing and disposing the mask are effectively reduced, and waste of materials is further reduced. The manufacturing costs can be further saved, so as to obtain a better protection for the environment. In the subsequent manufacturing process of the display panel, the dimensions of the spacer units is accurately controlled through precisely controlling the exposure energy, the penetration rates of the exposure units and the dimensions of the apertures of the exposure units. Hence, the specification of the spacer unit with a fine precision is further elevated. Therefore, the conformity of the cell gap of the liquid crystal cell is better controlled, and the light-leakage condition of the display panel is further reduced, such that the contrast ratio of the display panel is also further increased. The required second mask may be obtained via utilizing the production data, and the exposure energy can be accurately controlled through adopting the second mask. Hence, the manufacturing time of the spacer unit can be shortened, and the manufacturing capacity and the output of the display panel can also be increased. The manufacturing process of the display panel can be simplified, and the production efficiency of the display panel can be further improved.

Figure 2:
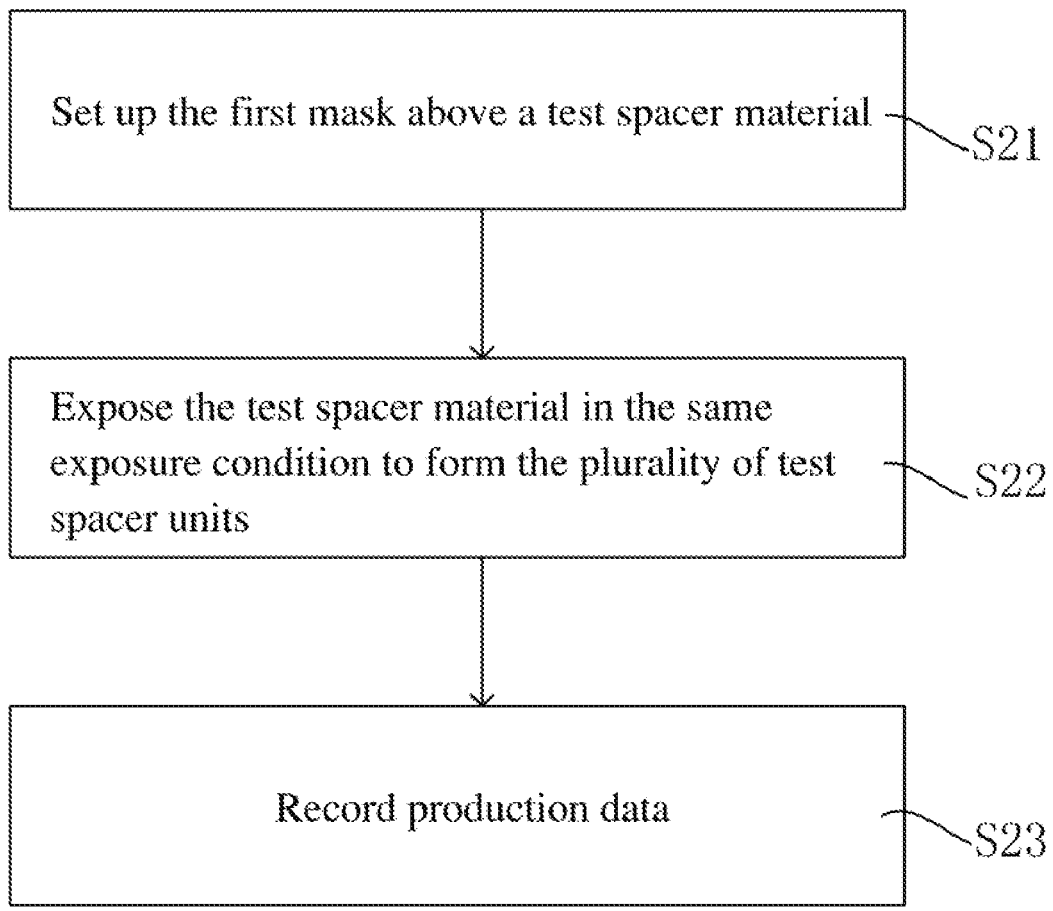
FIG. 2 is a flow chart showing a manufacturing method of a spacer unit of a display panel according to one embodiment of this disclosure.

As shown in FIG. 2, during forming a plurality of test spacer units through an exposure process with the first mask and recording production data the Step 2 comprises the following steps. Step S21: setting up the first mask above a test spacer material. Step S22: forming said test spacer units by exposing the test spacer material under the same exposure condition. And, Step S23: recording the production data.

The first mask is set up above a test spacer material. Through a plurality of exposure units with various penetration rates or various dimensions of apertures, disposed on the first mask, a plurality of sets of production data can be conveniently obtained after one-time exposure. Hence, the manufacturing time can be effectively shortened, and the testing cost can be reduced. The manufacturing capacity and the output of the display panel can be further increased. The manufacturing process of the display panel can be effectively simplified, and a better production efficiency of the display panel can be obtained. Moreover, the times of manufacturing and disposing the mask are effectively reduced, and waste of materials is further reduced. The manufacturing costs can be further saved, so as to obtain a better protection for the environment.

Figure 3:
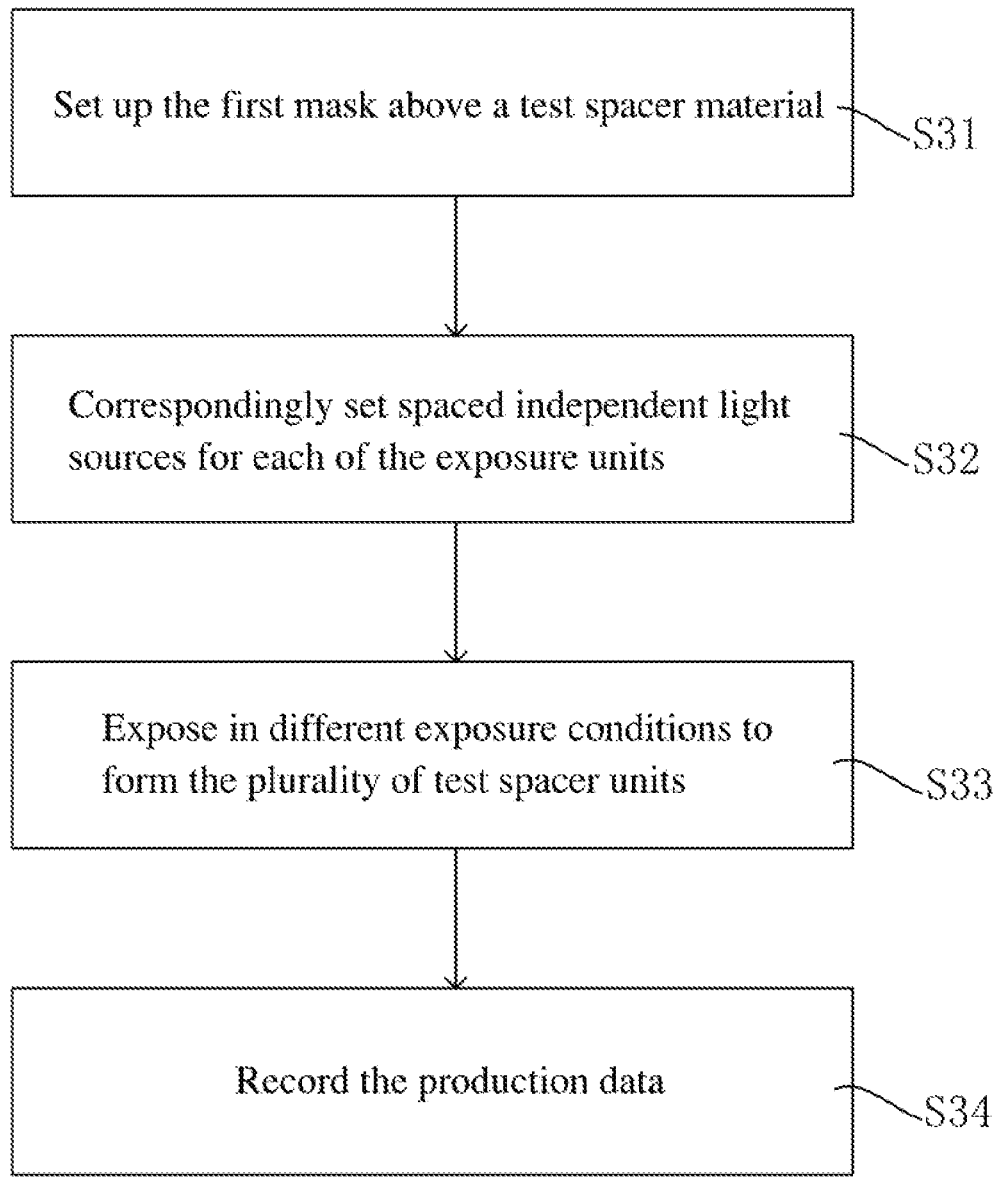
FIG. 3 is a flow chart showing a manufacturing method of a spacer unit of a display panel according to one embodiment of this disclosure.

As shown in FIG. 3, during forming a plurality of test spacer units through an exposure process with the first mask and recording production data, the method comprises the following steps. Step S31: setting up the first mask above a test spacer material. Step S32: setting one independent light source corresponding to each exposure unit, and the light sources are spaced from one another. Step S33: forming said test spacer units by exposing under different exposure conditions. And, Step S34: recording the production data.

The first mask is set up above a test spacer material. Since one independent light source is correspondingly set for each of the exposure units and these independent light sources are spaced from one another, it is possible to conveniently set different exposure energy for each of the exposure units. The penetration rates and the dimensions of the apertures of the exposure units are controlled to be the same, such that a plurality of sets of production data can be conveniently obtained after one-time exposure. Hence, the manufacturing time can be effectively shortened, and the testing cost can be reduced. The manufacturing capacity and the output of the display panel can be further increased. The manufacturing process of the display panel can be effectively simplified, and a better production efficiency of the display panel can be obtained. Moreover, the times of manufacturing and disposing the mask are effectively reduced, and waste of materials is further reduced. The manufacturing costs can be further saved, so as to obtain a better protection for the environment.

Optionally, the exposure units disposed on the first mask have the same penetration rate and same dimensions of the apertures. According to the practicing condition, more than six levels of exposure energy, such as 30 mJ, 40 mJ, 50 mJ, 60 mJ, 70 mJ, and 80 mJ are set for these exposure units. Through utilizing these various exposure energy and the first mask with the exposure units having the same dimensions (e.g., 1.6 mm×1.6 mm) of apertures and same penetration rates (e.g., 30%), the resultant spacer units are exposed with various exposure energy. Hence, it is possible to measure and collect the dimension data for each of the spacer units exposed by various exposure energy, so as to obtain the data with regard to the relationships of the exposure energy to the heights of the spacer units, the length and the width of the top surfaces of the spacer units, and the length and the width of the bottom surfaces of the spacer units, such that the production data is collected and obtained.

On the other hand, it is also possible to dispose single light source on the first mask, and by varying the exposure energy, to implement the above-mentioned method. Such configuration may further save the testing cost. The manufacturing process of the display panel can be effectively simplified, and a better manufacturing efficiency of the display panel is obtained.

Figure 4:
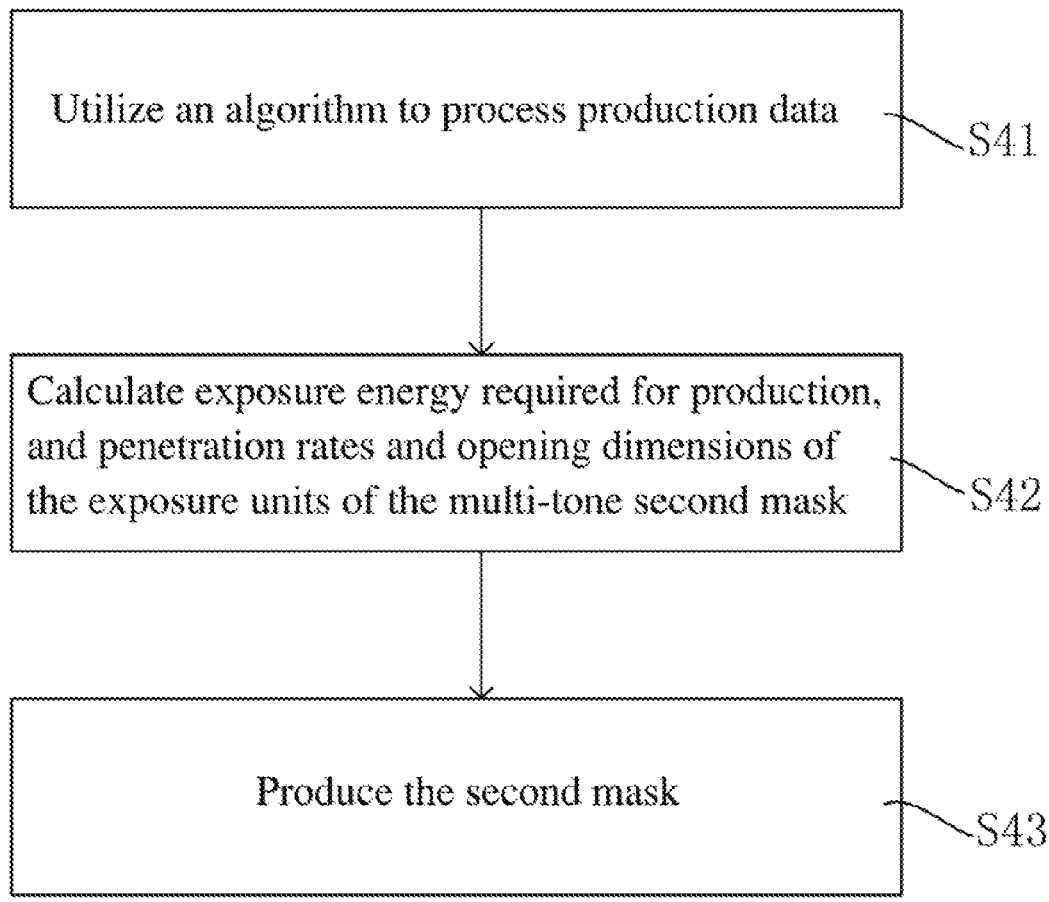
FIG. 4 is a flow chart showing a manufacturing method of a spacer unit of a display panel according to one embodiment of this disclosure.

As shown in FIG. 4, during providing a second mask for manufacturing the display panel based on the production data, the method comprises the following steps. Step S41: processing the production data by an algorithm. Step S42: calculating exposure energy required for production, and penetration rates and dimensions of the apertures of the exposure units of the multi-tone second mask. And, Step S43: producing the second mask.

An interpolation method may be used in the algorithm. According to requirements for the actual dimensions of the spacer units, the exposure energy required for production and the penetration rates and the dimensions of the apertures of the exposure units of the multi-tone second mask can be calculated via processing the production data with the interpolation method, so as to accurately control the dimensions of the spacer units. Therefore, the height and the shape of the spacer units can be controlled precisely, and the specification of the spacer units with fine precision can be further improved, so as to ensure the spacing units with more accurate heights and areas of the top surfaces and the bottom surfaces and better elastic recovery rates. Therefore, the conformity of the cell gap of the liquid crystal cell is better controlled, and the light-leakage condition of the display panel is further reduced, such that the contrast ratio of the display panel is also further increased. Hence, the image quality of the display panel can be effectively improved, such that a better display effect of the display penal is secured.

Figure 5:
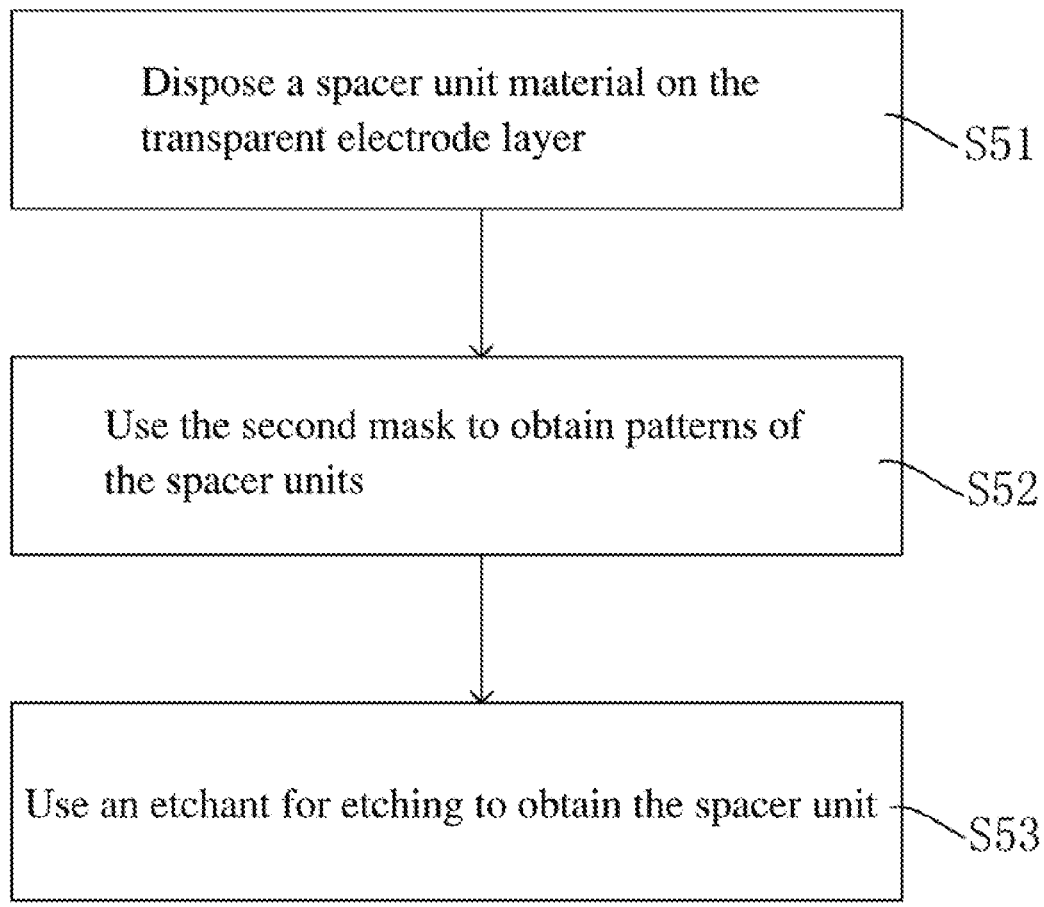
FIG. 5 is a flow chart showing a manufacturing method of a spacer unit of a display panel according to one embodiment of this disclosure.

As shown in FIG. 5, the display panel comprises a substrate and a transparent electrode layer disposed on the substrate, and during fabricating the spacer unit of the display panel by adopting the second mask, the method comprises the following steps. Step S51: disposing a spacer unit material on the transparent electrode layer. Step S52: obtaining patterns of the spacer units through the second mask. And, Step S53: obtaining the spacer units via etching with an etchant.

The spacer unit material is disposed on the transparent electrode layer, and second mask which meet the requirements for manufacturing the display penal is fabricated by adopting the production data. The second mask is used to precisely control the exposure energy, such that the production time of the spacer units can be effectively shortened and the manufacturing capacity and the output of the display panel can be further improved. The manufacturing process of the display panel can be simplified, and the manufacturing efficiency of the display panel can be also improved. In addition, an accurate control of the heights and the shapes of the spacer units is achieved by precisely controlling the exposure energy and the transmittance of the mask. The specification of the spacer units with fine precision is further improved, so as to ensure that the spacing units having more accurate heights and areas of the top surfaces and the bottom surfaces and better elastic recovery rates. Therefore, the conformity of the cell gap of the liquid crystal cell is better controlled, and the light-leakage condition of the display panel is further reduced, such that the contrast ratio of the display panel is also further increased. The detective dark pixel(s) can be effectively reduced. Hence, the image quality of the display panel can be effectively improved, such that a better display effect of the display penal is further secured.

Figure 6:
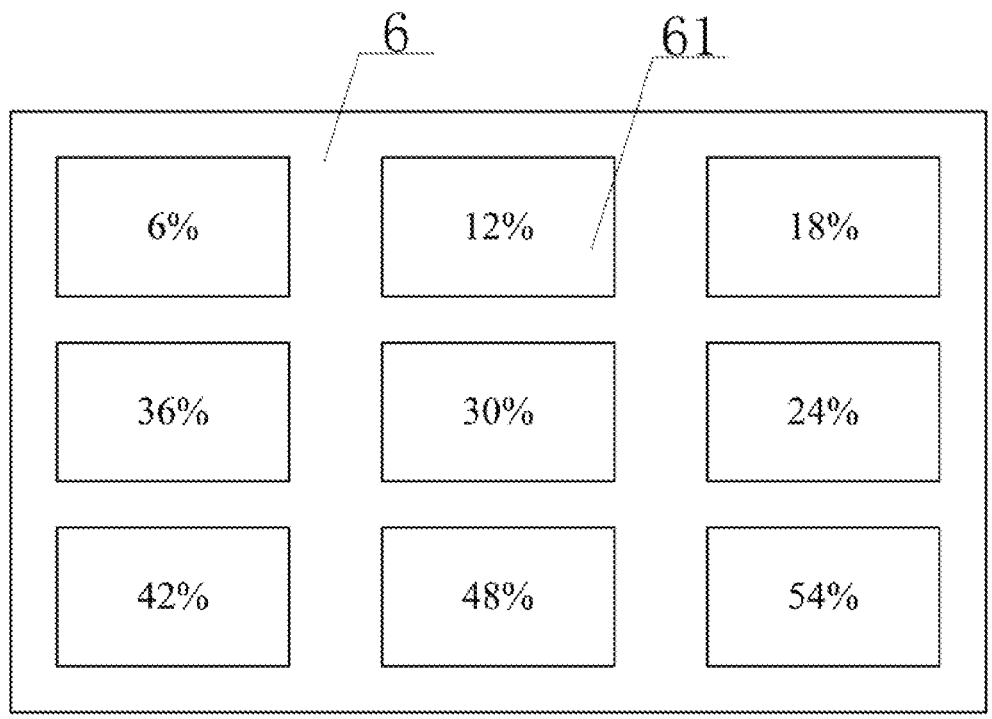
FIG. 6 is a schematic structure view showing a first mask according to one embodiment of this disclosure.

As shown in FIG. 6, the dimensions of the apertures are the same among the exposure units 61 in one first mask 6, and the penetration rates of any two of the exposure units 61 in said first mask 61 are different from each other. It is possible to conveniently obtain a plurality of sets of production data after one-time exposure. The manufacturing time can be effectively shortened, and the testing cost can be reduced. The manufacturing capacity and the output of the display panel can be further increased. The manufacturing process of the display panel can be effectively simplified, and a better production efficiency of the display panel can be obtained. Moreover, the times of manufacturing and disposing the mask are effectively reduced, and waste of materials is further reduced. The manufacturing costs can be further saved, so as to obtain a better protection for the environment. Exemplarily, the exposure units 61 with the same dimensions of apertures but various penetration rates are disposed on the first mask 6. According to the practicing conditions, more than 6, or even up to 9, types of penetration rates, such as 6%, 12%, 18%, 24%, 30%, 36%, 42%, 48%, and 54%, etc., are designed. Through utilizing the first mask 6 having these exposure units 61 with such various penetration rates and an uniform exposure condition (e.g., exposed under a condition of 50 mJ), it is possible to produce various spacer units because the energy absorbed by the photo-resistor varies with different penetration rates of the exposure units. Hence, it is possible to measure and collect the dimensional data for each of the spacer units, so as to obtain the data with regard to the relationships of the penetration rates to the heights of the spacer units, the length and the width of the top surfaces of the spacer units, and the length and the width of the bottom surfaces of the spacer units, such that the production data is collected and obtained.

In this embodiment, there may be a plurality of first masks 6. The dimensions of the apertures of the exposure units 61 may be varied for each of the first masks 6, and the penetration rates of the exposure units 61 at the same position for each first mask 6 are the same. For example, three first masks 6 are provided. In one first mask 6, dimensions of the apertures of the exposure units 61 are all 0.8×0.8 mm. In another first mask 6, dimensions of the apertures of the exposure units 61 are all 1.2×1.2 mm. And, in still another first mask 6, dimensions of the apertures of the exposure units 61 are all 1.6×1.6 mm. In addition, for each of the three first masks 6, the penetration rates of the exposure units 61 can be divided into six groups, such as 6%, 12%, 18%, 24%, 30% and 36%. In such manner, it is possible to conveniently test and collect the production data under different exposure energy. The testing time can be effectively shortened, and the manufacturing capacity and the output of the display panel can be further increased. The manufacturing process of the display panel can be effectively simplified, and a better production efficiency of the display panel can be obtained.

Figure 7:
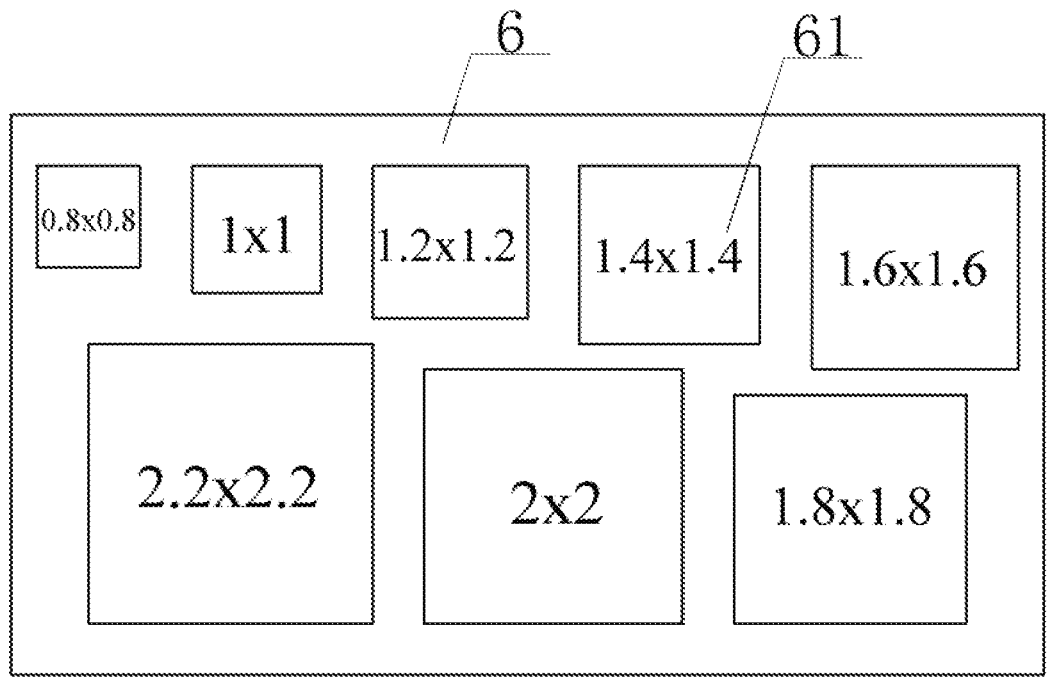
FIG. 7 is a schematic structure view showing a first mask according to one embodiment of this disclosure.

As shown in FIG. 7, the penetration rates of the exposure units 61 in one first mask 6 are the same, and the dimensions of the apertures of any two of the exposure units 61 are different. After one-time exposure, it is possible to conveniently obtain a plurality of sets of production data. The manufacturing time can be effectively shortened, and the testing cost can be reduced. The manufacturing capacity and the output of the display panel can be further increased. The manufacturing process of the display panel can be effectively simplified, and a better production efficiency of the display panel can be obtained. Moreover, the times of manufacturing and disposing the mask are effectively reduced, and waste of materials is further reduced. The manufacturing costs can be further saved, so as to obtain a better protection for the environment. For example, the exposure units 61 disposed on the first mask 6 have the same penetration rate of 12% but various dimensions of apertures. Ten or more dimensions of apertures are designed according to practicing conditions. The units of the dimensions of the apertures are in millimeters. In detail, the dimensions of the apertures are 0.8×0.8 mm, 1×1 mm, 1.2×1.2 mm, 1.4×1.4 mm, 1.6×1.6 mm, 1.8×1.8 mm, 2×2 mm, 2.2×2.2 mm, 2.4×2.4 mm, 2.6×2.6 mm. Through utilizing the first mask 6 having exposure units 61 with these various dimensions of apertures and an uniform exposure condition (e.g., exposed under a condition of 50 mJ), it is possible to produce various spacer units based on such different dimensions of apertures of the exposure units 61. Hence, it is possible to measure and collect the dimensional data for each of the spacer units, so as to obtain the data with regard to the relationships of the dimensions of the apertures to the heights of the spacer units, the length and the width of the top surfaces of the spacer units, and the length and the width of the bottom surfaces of the spacer units.

Exemplarily, the exposure units 61 disposed on the first mask 6 have the same penetration rates of 17% but various dimensions of apertures. Ten or more dimensions of apertures are designed according to practicing conditions. The units of the dimensions of the apertures are in millimeters. In detail, the dimensions of the apertures are 0.8×0.8 mm, 1×1 mm, 1.2×1.2 mm, 1.4×1.4 mm, 1.6×1.6 mm, 1.8×1.8 mm, 2×2 mm, 2.2×2.2 mm, 2.4×2.4 mm, 2.6×2.6 mm. Through utilizing the first mask 6 having exposure units 61 with these various dimensions of apertures and an uniform exposure condition (e.g., exposed under a condition of 60 mJ), it is possible to produce various spacer units based on such different dimensions of apertures of the exposure units 61. Hence, it is possible to measure and collect the dimensional data for each of the spacer units, so as to obtain the data with regard to the relationships of the dimensions of the apertures to the heights of the spacer units, the length and the width of the top surfaces of the spacer units, and the length and the width of the bottom surfaces of the spacer units.

In this embodiment, there may be a plurality of first masks 6. The dimensions of the apertures of the exposure units 61 may be varied for each of the first masks 6, and the penetration rates of the exposure units 61 at the same position for each first mask 6 are the same. For example, three first masks 6 are provided. In one first mask 6, dimensions of the apertures of the exposure units 61 are all 0.8×0.8 mm. In another first mask 6, dimensions of the apertures of the exposure units 61 are all 1.2×1.2 mm. And, in still another first mask 6, dimensions of the apertures of the exposure units 61 are all 1.6×1.6 mm. In addition, for each of the three first masks 6, the penetration rates of the exposure units 61 can be divided into six groups, such as 6%, 12%, 18%, 24%, 30% and 36%. In such manner, it is possible to conveniently test and collect the production data under different exposure energy. The testing time can be effectively shortened, and the manufacturing capacity and the output of the display panel can be further increased. The manufacturing process of the display panel can be effectively simplified, and a better production efficiency of the display panel can be obtained.

In one embodiments, the dimensions of the spacer units comprises the heights of the spacer units, the lengths and the widths of the top surfaces of the spacer units, and the lengths and the widths of the bottom surfaces of the spacer units.

Figure 8:
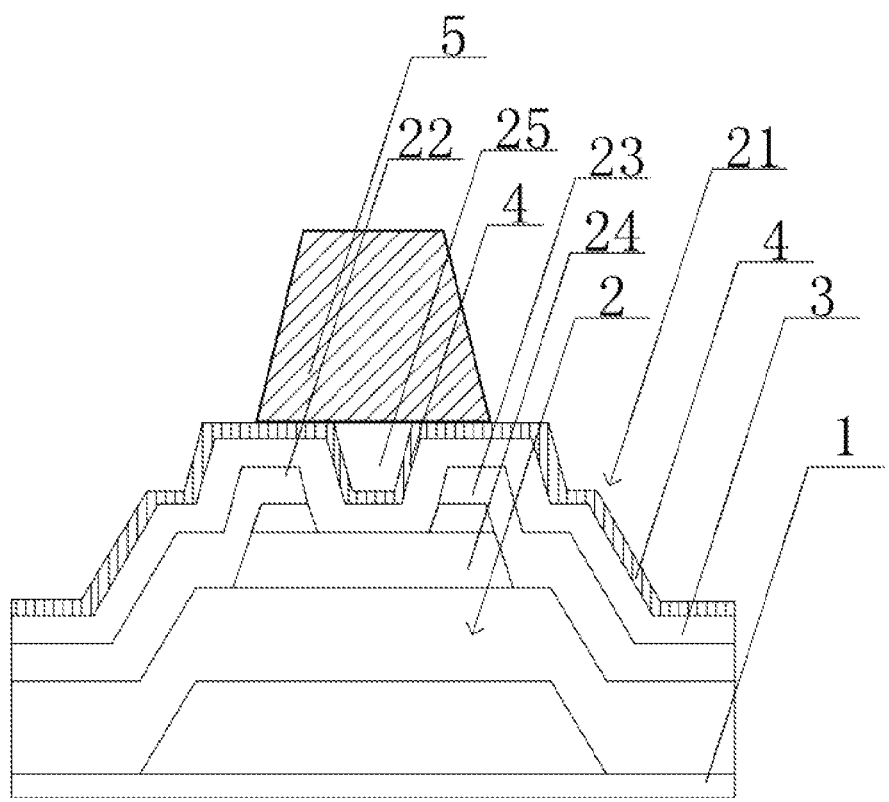
FIG. 8 is a schematically cross-sectional view according to another implementation method of the display panel of one embodiment of this disclosure.

As shown in FIG. 8, an active switch 2 includes a gate 21 disposed on a substrate 1. An insulating layer is disposed on the gate 21, and a semiconductor layer 24 is disposed on the insulating layer corresponding to the gate 21. A source 22 and a drain 23 of the active switch 2 are disposed on two ends of the semiconductor layer 24 and separated from each other. A trench 25 is disposed between the source 22 and the drain 23, and the semiconductor layer 24 is disposed at the bottom of the trench 25.

A protection layer 3 can effectively prevent the cleaning agent from directly eroding the source 22 and the drain 23 of the display panel, so that the source 22 and the drain 23 can be kept intact, and the occurrence of breakage problems can be reduced. Hence, the manufacture yield of the active matrix substrate 1 is improved and the scrapping cost is reduced accordingly. Since the source 22 and the drain 23 are made of metal, the lateral sides of the source 22 and the drain 23 may have metal burrs under a microscopic view. The protection layer 3 can be disposed to provide a better cover of metal burrs of the source 22 and the drain 23. Hence, in such manner, the metal burrs can be effectively prevented from exposing outside of the protection layer 3, so as to make the protection layer 3 to protect the source 22 and the drain 23 better and to effectively avoid the impacts resulting from subsequent processes on the source 22 and the drain 23. Therefore, the yield of the display panel can be improved.

In some embodiments, the protection layer 3 may be provided in a two-layered configuration, which are, namely, a first protection layer and a second protection layer. In such configuration, the first protection layer is covered on the substrate 1, and the second protection layer is covered on the first protection layer, thereby better covering the metal burrs on the metal layer. The first protection layer can effectively cover the metal burrs, and the second protection layer can effectively cover the metal burrs exposed from the first protection layer. Accordingly, the metal burrs are effectively prevented from being exposed outside of the protection layer 3, such that the protection layer 3 may provide a better protection for the metal layer and can effectively prevent the cleaning agent from directly eroding the metal layer of the display panel. Hence, the metal layer can be kept intact and the occurrence of breakage problems may be avoided. Therefore, the durability of the display panel can be improved. Meanwhile, the disposing of the protection layer 3 can effectively improve the yield of the display panel. The scrap rate of the active switch 2 and the array substrate 1 can also be reduced, so as to obtain a better protection for the environment.

A transparent electrode layer 4 is disposed between the spacer unit 5 and the active switch 2. The transparent electrode layer 4 can be obtained just through an exposure process performed at a specific position with a mask specially designed for the transparent electrode layer 4. It can ensure that the spacer unit 5 can be better supported whereas the costs remained unchanged, and that the display panel may have a better image quality. Additional raw materials are not required. The cost of raw material and the storage cost are saved. Moreover, no new materials are required to be added to the bill of materials. It is convenient to manage the manufacturing flow and purchase. No additional apparatus for disposing the transparent electrode layer 4 is needed. One set of equipment apparatus may be shared with the transparent electrode layer 4 of the pixel electrode, and additional equipment and materials are also not required for the subsequent etching process.

The spacer unit 5 is disposed across the trench 25, so that the spacer unit 5 can readily supported on both sides of the trench 25, and the spacer unit 5 can be more stably disposed on the transparent electrode layer 4. It is possible to effectively prevent the spacer unit 5 from shifting, so as to ensure that the liquid crystal molecules in the liquid crystal cell can work efficiently, and hence, that the chrominance and the brightness of the display panel become more homogeneous. The display effect of the display panel is further improved, so that the product may have a better competitiveness. In addition, the transversal cross section of the spacer unit 5 is quadrilateral. It may effectively prevent the spacer unit 5 from rolling, so that the spacer unit 5 can be effectively fixed on the active switch 2. In addition, the problem that spherical shaped spacer materials tend to gather can be well overcome. Therefore, defective pixels and damages to color filters may be effectively avoided, so as to effectively protect the color filters and further improve the durability of the display panel. Hence, the display panel may have a longer lifetime.

The width of one side of the spacer unit 5 which is in contact with the transparent electrode layer 4 is greater than the width of the other side. In other words, the width of the bottom portion of the spacer unit 5 is greater than that of the top portion, so that the manufacturing of the gate 21 is easier, the shaping is more stable, and the yield is higher. In addition, the contact area at the bottom portion of the spacer unit 5 is relatively larger, such that a better adhesive effect is secured and the spacer unit 5 can be fixed more firmly. The cross section of the spacer unit 5 is preferably a trapezoid, especially an isosceles trapezoid. For such configuration, in the subsequent processes, such as polarizer bonding process, thinning process, and pressing test, etc., squeezing effects occurred on the spacer unit 5, and in turn on the active switch 2, exerted from external forces can be effectively reduced. In such manner, a better electrical performance of the active switch 2 can be secured, and the occurrence of the defective dark pixels observed during lighting or pressing may also be reduced.

The spacer unit 5 includes two kinds of light initiators. The spacer unit 5 includes photosensitive spacer materials with two kinds of light initiators. When a multi-tone mask with various penetration rates is used, the shape and size of the spacer unit 5 can be adjusted and controlled by adjusting (or, namely, reducing) the exposure energy. The cost of manufacturing and disposing a new mask is saved, and a precise design value of the penetration rate can be obtained. Meanwhile, the exposure energy can be controlled to effectively shorten the manufacturing time and testing costs. The manufacturing capacity and the output of the display panel can be further increased. The manufacturing process of the display panel can be effectively simplified, and a better production efficiency of the display panel can be obtained. In addition, the heights and shapes of the spacer units 5 are accurately controlled through precisely controlling the exposure energy and the penetration rates of the mask. Hence, the specification of the spacer unit 5 with a fine precision is further improved, so as to ensure that the spacing units having more accurate heights and areas of the top surfaces and the bottom surfaces and better elastic recovery rates. Therefore, the conformity of the cell gap of the liquid crystal cell is better controlled, and the light-leakage condition of the display panel is further reduced, such that the contrast ratio of the display panel is also further increased. In addition, since the photosensitive spacer material has a better hardness, an effective supporting effect can be secured, and the liquid crystal molecules in the liquid crystal cell may work efficiently, and, hence, the chrominance and the brightness of the display panel become more homogeneous. The display effect of the display panel is further improved. In addition, it is possible to further decrease the influence on the electrical property of the active switch 2 and further improve the problem of the defective dark pixels observed during lighting. The display panel may have a better display effect and the image quality of the display panel is further increased.

Photosensitive spacer materials have good thermal resistance and the excellent resistance to chemical corrosion so as to ensure that the display panel can work efficiently and that the display has a good quality. The spacer units 5 have high transmittance and contrast ratio so as to ensure that the chrominance and the brightness of the display panel to become more homogeneous and to effectively improve the quality of the display panel. At the same time, there is a good adhesion between the spacer units 5 and the transparent electrode layer, so that the spacer unit 5 is fixed. It is possible to effectively prevent the spacer unit 5 from shifting, so as to ensure that the liquid crystal molecules in the liquid crystal cell can work efficiently, and hence, that the chrominance and the brightness of the display panel become more homogeneous. The display effect of the display panel is further improved, so that the product may have a better competitiveness. The photosensitive spacer materials are polymeric resin mixtures having photosensitivity. The manufacturing method thereof includes the following steps: coating photosensitive spacer materials on the transparent electrode layer, obtaining a designated thickness and shape of the spacer unit 5 through processes of exposing, developing, baking, and etc. The substrate 1 having the spacer unit 5 is then directly bonded to another substrate. A liquid crystal cell is formed directly between two spacer units 5. The shape of the spacer unit 5 is controlled through a lithography process. Through controlling the shape of the mask and the exposure time can thus effectively control the resulting thickness and the shape of the spacer units 5. The spacer units 5 can be secured to provide an effective supporting effect, and it can effectively reduce deformation of the active switch 2 caused by an external force exerting on the spacer unit 5 in subsequent processes. In addition, it is possible to further decrease the influence on the electrical property of the active switch 2 and further improve the problem of the defective dark pixels observed during lighting. The display panel may have a better display effect and the image quality of the display panel is further increased.

Figure 9:
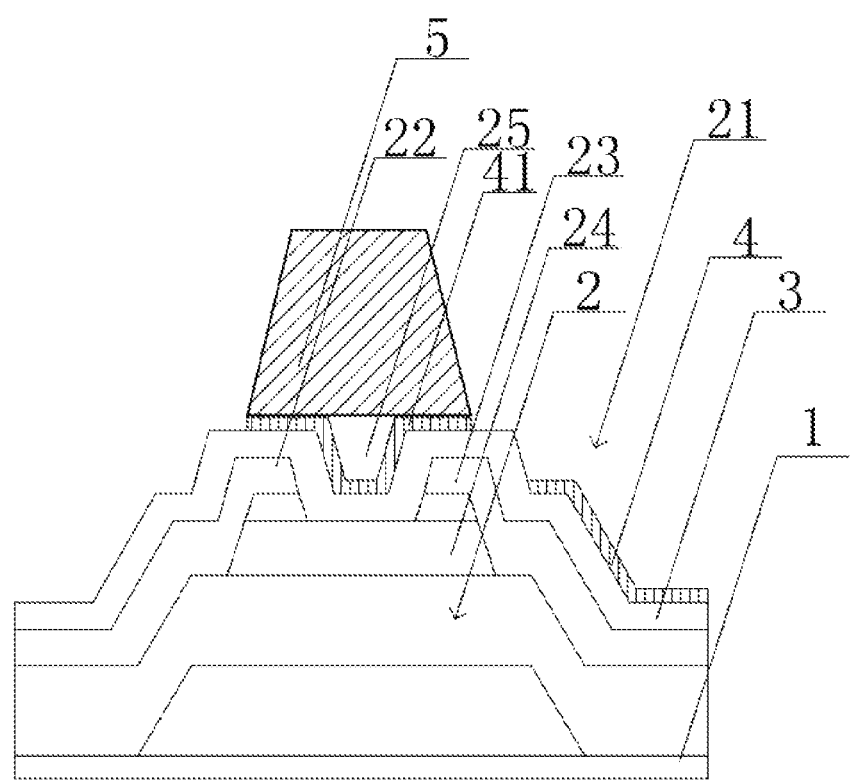
FIG. 9 is a schematically cross-sectional view according to another implementation method of the display panel of one embodiment of this disclosure.

As shown in FIG. 9, a display panel manufactured via the embodying method(s) comprises a substrate 1, at least one active switch 2 disposed on the substrate 1, and at least one protection layer 3 covering said active switch 2. At least one spacer unit 5 is disposed on said active switch 2, and said spacer unit 5 is disposed above said protection layer 3. At least one first transparent electrode layer 41 is disposed between said spacer unit 5 and said protection layer 3 and on a surface of said protection layer 3 facing said spacer unit 5. Said first transparent electrode layer 41 is disposed along said spacer unit 5 in the orthogonally projected region on said protection layer 3. It can effectively provide a supporting function and to effectively save consumable materials simultaneously. It is beneficial to further reduce manufacturing costs of the display panel and to effectively enhance the product competitiveness for the display panel. It can also effective support the spacer units 5, so as to effectively reduce the deformation of the active switch 2 resulting from external forces applying on the spacer units 5 in subsequent processes. In addition, it is possible to further decrease the influence on the electrical property of the active switch 2 and further improve the problem of the defective dark pixels observed during lighting. The display panel may have a better display effect and the image quality of the display panel is further increased.

The width of one side of the spacer unit 5 which is in contact with the first transparent electrode layer 41 is greater than the width of the other side. In other words, the width of the bottom portion of the spacer unit 5 is greater than that of the top portion, so that the manufacturing of the gate 21 is easier, the shaping is more stable, and the yield is higher. In addition, the contact area at the bottom portion of the spacer unit 5 is relatively larger, such that a better adhesive effect is secured and the spacer unit 5 can be fixed more firmly. The cross section of the spacer unit 5 is preferably a trapezoid, especially an isosceles trapezoid. For such configuration, in the subsequent processes, such as a polarizer bonding process, a thinning process, and a pressing test, etc., squeezing effects occurred on the spacer unit 5, and in turn on the active switch 2, exerted from external forces can be effectively reduced. In such manner, a better electrical performance of the active switch 2 can be secured, and the occurrence of the defective dark pixels observed during lighting or pressing may also be reduced.

Figure 10:
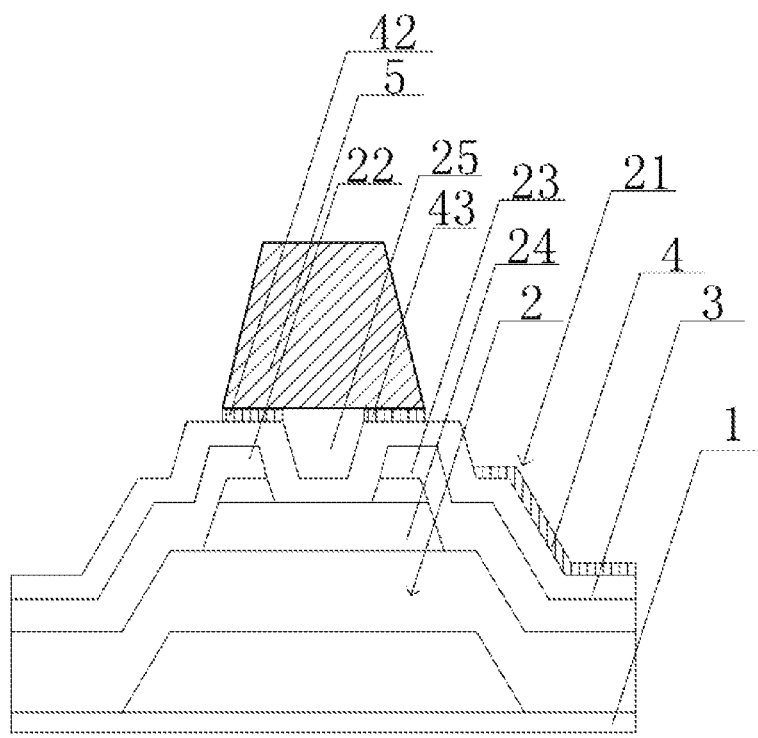
FIG. 10 is a schematically cross-sectional view according to another implementation method of the display panel of one embodiment of this disclosure.

As shown in FIG. 10, a display panel, provided by the embodying method(s), comprises a substrate 1, at least an active switch 2 disposed on the substrate 1, and at least a protection layer 3 covering the active switch 2. At least a spacer unit 5 is disposed on the active switch 2, and the spacer unit 5 is disposed above the protection layer 3. The transparent electrode layer 4 is disposed the spacer unit 5 and the protection layer 3 and disposed on a surface of the protection layer 3 facing the spacer unit 5. The transparent electrode layer 4 comprises a second transparent electrode layer 42 and a third transparent electrode layer 43. The trench 25 is disposed between the second transparent electrode layer 42 and the third transparent electrode layer 43. The second transparent electrode layer 42 is disposed on the protection layer 3 above the source 22. The third transparent electrode layer 43 is disposed on the protection layer 3 above the drain 23, and the second transparent electrode layer 42 and the third transparent electrode layer 43 support the spacer unit 5. Such configuration can provide an effectively support to the spacer unit 5, so as to effectively reduce the deformation of the active switch 2 resulting from external forces applying on the spacer units 5 in subsequent processes. In addition, it is possible to further decrease the influence on the electrical property of the active switch 2 and further improve the problem of the defective dark pixels observed during lighting. The display panel may have a better display effect and the image quality of the display panel is further increased. In addition, such configuration to dispose the transparent electrode layer 4 on two ends of the trench 25 can effectively reduce the manufacturing difficulty as long as a specific position for exposure is designed on the mask used in the manufacturing process for the transparent electrode layer 4. It can ensure that the spacer unit 5 can be better supported whereas the costs remained unchanged, and that the display panel may have a better image quality. Additional raw materials are not required. The cost of raw material and the storage cost are saved. Moreover, no new materials are required to be added to the bill of materials. It is convenient to manage the manufacturing flow and purchase. No additional apparatus for disposing the transparent electrode layer 4 is needed. One set of equipment apparatus may be shared with the pixel electrode, and additional equipment and materials are also not required for the subsequent etching process.

Figure 11:
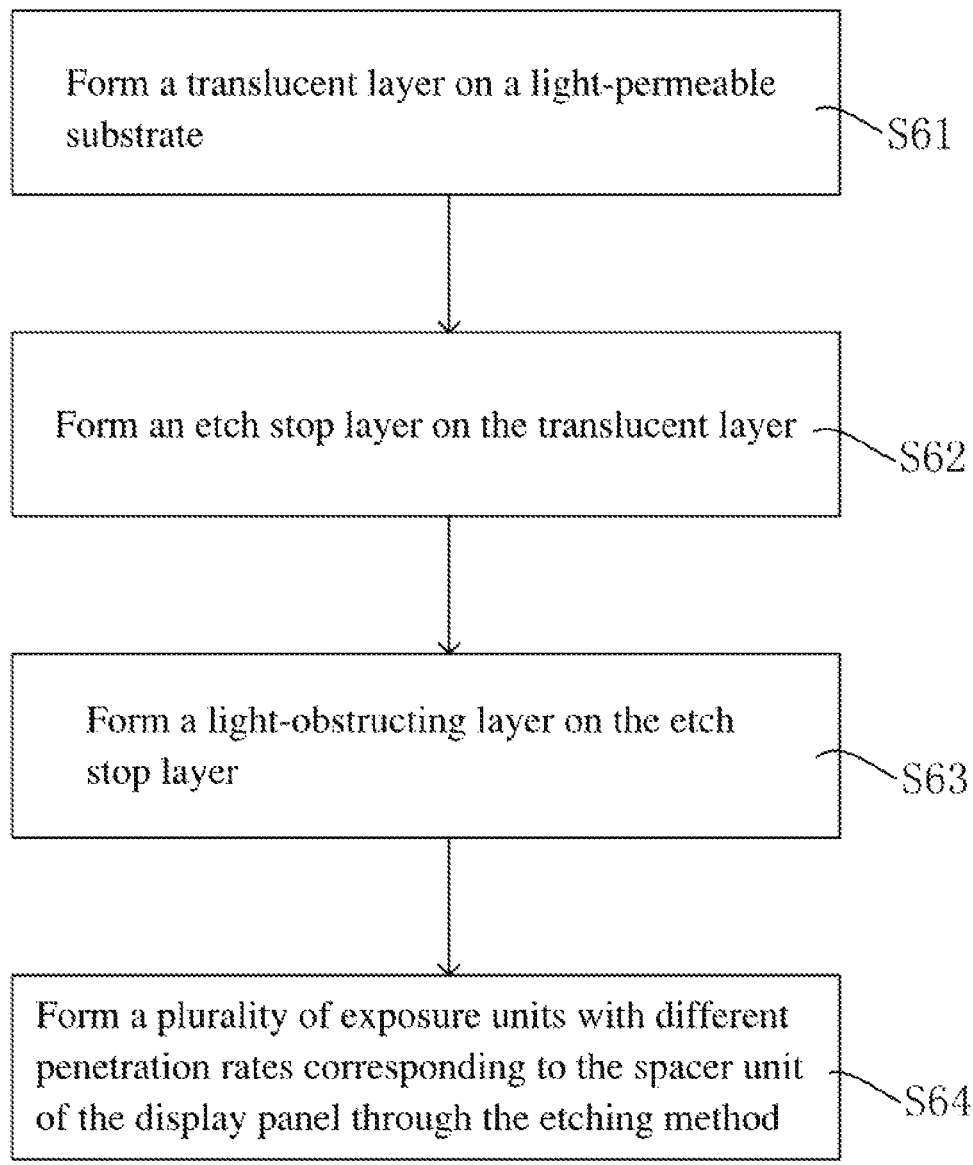
FIG. 11 is a flow chart showing a manufacturing method of a mask according to one embodiment of this disclosure.

As shown in FIG. 11, this disclosure further provides a method for manufacturing a mask according to another aspect of this disclosure. This method comprises the following steps. Step S61: forming a translucent layer on a transparent substrate. Step S62: forming an etching stop layer on the translucent layer. Step S63: forming a light-shielding layer on the etching stop layer. And, Step S64: forming a plurality of exposure units with various penetration rates corresponding to the spacer units of the display panel via an etching process.

The mask provided by the preceding method is the second mask of the aforementioned embodiment(s), and it can be directly used in the manufacturing process of the display panel.

Figure 12:
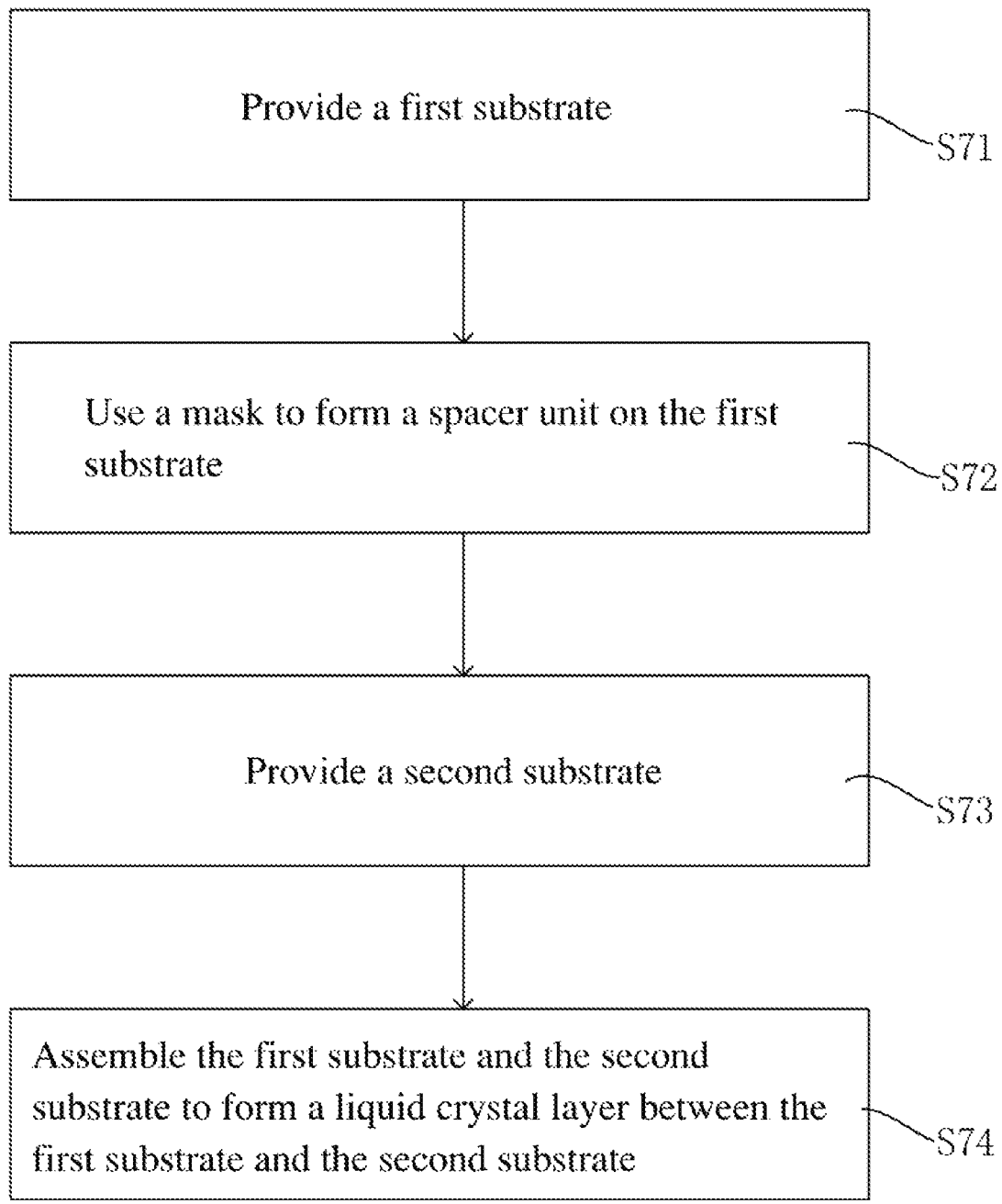
FIG. 12 is a flow schematic view showing a manufacturing method of the display panel according to one embodiment of this disclosure.

As shown in FIG. 12, this disclosure further provides a method of manufacturing the display panel according to another aspect of this disclosure. The manufacturing method comprises the following steps. Step S71: providing a first substrate. Step S72: forming at least a spacer unit on the first substrate by adopting a mask, and the mask comprises a plurality of exposure units with various penetration rates. Step S73: providing a second substrate. And, Step S74: assembling the first substrate and the second substrate and forming a liquid crystal layer between the first substrate and the second substrate.

The mask used in the preceding method is the second mask of the aforementioned embodiment(s), and it can be directly used in the manufacturing process of the display panel.

In the aforementioned embodiments, the material of the substrate 1 may be optionally glass plastic, or the like.

In the aforementioned embodiments, the display panel may include a liquid crystal panel, a plasma panel or the like. The liquid crystal panel, for example, comprises an array substrate and a color filter substrate (CF) disposed opposite to each other. Thin film transistors (TFT) are disposed on the array substrate, and a color filter layer is disposed on the color filter substrate.

In the aforementioned embodiments, the color filter substrate may include a TFT array, the color filter and the TFT array may be formed on the same substrate. The array substrate may include a color filter layer.

The display panel may be a TN, OCB or VA typed LCD, or may be a curved LCD, but it is not limited thereto. The display panel may be supplied with a direct type backlight module, and the light sources in the backlight module may be white light sources, RGB light sources, RGBW light sources, or RGBY light sources, but they are not limited thereto.

In the aforementioned embodiments, the liquid crystal panel provided by the disclosure can be a curved panel.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for manufacturing a spacer unit of a display panel, comprising:
setting up a multi-tone first mask, wherein at least two exposure units are disposed on the multi-tone first mask;
forming a plurality of test spacer units through an exposure process using the first mask and recording production data;
providing a second mask for manufacturing the display panel based on the production data; and
fabricating the spacer unit of the display panel by adopting the second mask,
wherein during forming the plurality of test spacer units through the exposure process using the first mask and recording production data, the method comprises:
setting up the first mask above a test spacer material;
setting one independent light source corresponding to each exposure unit, wherein the light sources are spaced from one another;
forming said test spacer units by exposing under different exposure conditions; and
recording the production data.

2. The method according to claim 1, wherein during providing a second mask for manufacturing the display panel based on the production data, the method comprises:
   processing the production data by an algorithm;
   calculating exposure energy required for production, and penetration rates and dimensions of apertures of exposure units of the second mask of multi-tone; and
   producing the second mask.

3. The method according to claim 1, wherein the display panel comprises a substrate and a transparent electrode layer disposed on the substrate, and during fabricating the spacer unit of the display panel by adopting the second mask, the method comprises:
   disposing a spacer unit material on the transparent electrode layer;
   obtaining patterns of the spacer units through the second mask; and
   obtaining the spacer units via etching with an etchant.

4. The method according to claim 1, wherein during forming a plurality of test spacer units through an exposure process using the first mask and recording production data, the method comprises:
   setting up the first mask above a test spacer material;
   setting one independent light source corresponding to each exposure unit, wherein the light sources are spaced from one another;
   forming the test spacer units by exposing under different exposure conditions; and
   recording the production data;
   wherein the dimensions of the apertures of the exposure units of the first mask are the same, and the penetration rates of any two of the exposure units are different.

5. The method according to claim 1, wherein during providing a second mask for fabricating the display panel based on the production data, the method comprises:
   processing the production data by an algorithm;
   calculating exposure energy required for production, and penetration rates and dimensions of apertures of exposure units of the second mask of multi-tone; and
   producing the second mask;
   wherein the dimensions of the apertures of the exposure units of the first mask are the same, and the penetration rates of any two of the exposure units are different.

6. The method according to claim 1, wherein the display panel comprises a substrate and a transparent electrode layer disposed on the substrate, and during fabricating the spacer unit of the display panel by adopting the second mask, the method comprises:
   disposing a spacer unit material on the transparent electrode layer;
   obtaining patterns of the spacer units by the second mask; and
   obtaining the spacer units by etching with an etchant;
   wherein the dimensions of the apertures of the exposure units of the first mask are the same, and the penetration rates of any two of the exposure units are different.

7. The method according to claim 1, wherein the dimensions of the apertures of the exposure units of the first mask are the same, and the penetration rates of any two of the exposure units are different.

8. The method according to claim 6, wherein there are a plurality of first masks, the dimensions of the apertures of the exposure units are varied for each first mask, and the penetration rates of the exposure units at the same position of each first mask are the same.

9. The method according to claim 1, wherein there are a plurality of first masks, and during forming a plurality of test spacer units through an exposure process using the first mask and recording, the method comprises:
   setting up the first mask above a test spacer material;
   setting one independent light source corresponding to each exposure unit, wherein the light sources are spaced from one another;
   exposing in different exposure conditions to form the test spacer units; and
   recording the production data;
   wherein the penetration rates of the exposure units in the same first mask are the same, and the dimensions of the apertures of any two of the exposure units in the same first mask are different, and wherein the dimensions of the apertures of the exposure units are varied for each first mask, and the penetration rates of the exposure units at the same position of each first mask are the same.

10. The method according to claim 1, wherein there are a plurality of first masks, and during providing a second mask for manufacturing the display panel based on the production data, the method comprises:
    processing the production data by an algorithm;
    calculating exposure energy required for production, and penetration rates and dimensions of apertures of the exposure units of the second mask of multi-tone; and
    producing the second mask;
    wherein and the penetration rates of the exposure units in the same first mask are the same, and the dimensions of the apertures of any two of the exposure units in the same first mask are different, and wherein the dimensions of the apertures of the exposure units are varied for each first mask, and the penetration rates of the exposure units at the same position of each first mask are the same.

11. The method according to claim 1, wherein there are a plurality of first masks, the display panel comprises a substrate and a transparent electrode layer disposed on the substrate, and during fabricating the spacer unit of the display panel by adopting the second mask, the method comprises:
    disposing a spacer unit material on the transparent electrode layer;
    obtaining patterns of the spacer units by the second mask; and
    obtaining the spacer units by etching with an etchant;
    wherein the penetration rates of the exposure units in the same first mask are the same, and the dimensions of the apertures of any two of the exposure units in the same first mask are different, and wherein the dimensions of the apertures of the exposure units are varied for each first mask, and the penetration rates of the exposure units at the same position of each first mask are the same.

12. The method according to claim 1, wherein there are a plurality of first masks, and the penetration rates of the exposure units in the same first mask are the same, and the dimensions of the apertures of any two of the exposure units in the same first mask are different, and wherein the dimensions of the apertures of the exposure units are varied for each first mask, and the penetration rates of the exposure units at the same position of each first mask are the same.

13. A method for manufacturing a display panel, comprising:
    providing a first substrate;
    forming a spacer unit according to the method of claim 1 on the first substrate;
    providing a second substrate; and assembling the first substrate and the second substrate and forming a liquid crystal layer between the first substrate and the second substrate.

14. A method for manufacturing a spacer unit of a display panel, comprising steps of:
- setting up a multi-tone first mask, wherein at least two exposure units are disposed on the multi-tone first mask;
- setting up the first mask above a test spacer material;
- setting one independent light source corresponding to each exposure unit, wherein the light sources are spaced from one another;
- forming the test spacer units by exposing under different exposure conditions;
- recording production data;
- processing the production data by an algorithm;
- calculating exposure energy required for production, and penetration rates and dimensions of apertures of exposure units of a second mask of multi-tone;
- producing the second mask;
- disposing a spacer unit material on a transparent electrode layer;
- obtaining patterns of the spacer units by adopting the second mask; and
- obtaining the spacer units by etching with an etchant.

15. The method according to claim 4, wherein there are a plurality of first masks, the dimensions of the apertures of the exposure units are varied for each first mask, and the penetration rates of the exposure units at the same position of each first mask are the same.

16. The method according to claim 5, wherein there are a plurality of first masks, the dimensions of the apertures of the exposure units are varied for each first mask, and the penetration rates of the exposure units at the same position of each first mask are the same.

* * * * *